United States Patent
Kudekar et al.

(10) Patent No.: US 10,348,451 B2
(45) Date of Patent: Jul. 9, 2019

(54) ENHANCED POLAR CODE CONSTRUCTIONS BY STRATEGIC PLACEMENT OF CRC BITS

(71) Applicant: QUALCOMM Incorporated, San Diego, CA (US)

(72) Inventors: Shrinivas Kudekar, Raritan, NJ (US); Thomas Richardson, South Orange, NJ (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/919,303

(22) Filed: Mar. 13, 2018

(65) Prior Publication Data
US 2018/0205498 A1 Jul. 19, 2018

Related U.S. Application Data

(63) Continuation of application No. 15/395,713, filed on Dec. 30, 2016, now Pat. No. 9,917,675.
(Continued)

(51) Int. Cl.
*H04L 1/00* (2006.01)
*H03M 13/00* (2006.01)
(Continued)

(52) U.S. Cl.
CPC .......... *H04L 1/0063* (2013.01); *H03M 13/09* (2013.01); *H03M 13/098* (2013.01);
(Continued)

(58) Field of Classification Search
CPC .......... H03M 13/2906; H03M 13/098; H03M 13/6343; H04L 1/0061; H04L 1/0063
See application file for complete search history.

(56) References Cited

U.S. PATENT DOCUMENTS 5,583,500 A 12/1996 Allen et al.
5,844,918 A 12/1998 Kato
(Continued)

FOREIGN PATENT DOCUMENTS

CN 101682381 A 3/2010
CN 102783206 A 11/2012
(Continued)

OTHER PUBLICATIONS

Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.
(Continued)

*Primary Examiner* — Sung S Ahn
(74) *Attorney, Agent, or Firm* — Qualcomm IP Dept.; James Hunt Yancey, Jr.

(57) ABSTRACT

Certain aspects of the present disclosure relate to techniques and apparatus for improving decoding latency and performance of Polar codes. An exemplary method generally includes generating a codeword by encoding information bits, using a multi-dimensional interpretation of a polar code of length N, determining, based on one or more criteria, a plurality of locations within the codeword to insert error correction codes generating the error correction codes based on corresponding portions of the information bits, inserting the error correction codes at the determined plurality of locations, and transmitting the codeword. Other aspects, embodiments, and features are also claimed and described.

13 Claims, 9 Drawing Sheets

Related U.S. Application Data

(60) Provisional application No. 62/344,031, filed on Jun. 1, 2016.

(51) Int. Cl.
*H03M 13/09* (2006.01)
*H03M 13/13* (2006.01)
*H03M 13/37* (2006.01)
*H03M 13/39* (2006.01)

(52) U.S. Cl.
CPC ....... *H03M 13/13* (2013.01); *H03M 13/3738* (2013.01); *H03M 13/3977* (2013.01); *H03M 13/612* (2013.01); *H04L 1/0041* (2013.01); *H04L 1/0045* (2013.01); *H04L 1/0054* (2013.01); *H04L 1/0057* (2013.01); *H04L 1/0061* (2013.01)

(56) References Cited

U.S. PATENT DOCUMENTS

| | | |
|---|---|---|
| 6,633,865 B1 | 10/2003 | Liao |
| 6,854,082 B1 | 2/2005 | Rhee |
| 6,931,581 B1 | 8/2005 | Cassiday et al. |
| 6,961,888 B2 | 11/2005 | Jin et al. |
| 7,133,853 B2 | 11/2006 | Richardson et al. |
| 7,526,717 B2 | 4/2009 | Kyung et al. |
| 7,552,097 B2 | 6/2009 | Richardson et al. |
| 7,571,372 B1* | 8/2009 | Burd ................ G11B 20/1833 714/769 |
| 7,627,801 B2 | 12/2009 | Jin et al. |
| 7,793,194 B2 | 9/2010 | Seo et al. |
| 7,840,880 B1 | 11/2010 | Bain |
| 7,979,784 B2 | 7/2011 | Shao et al. |
| 7,986,622 B2 | 7/2011 | Frazier et al. |
| 8,006,162 B2 | 8/2011 | Choi et al. |
| 8,132,072 B2 | 3/2012 | El-Khamy et al. |
| 8,687,751 B1 | 4/2014 | Lee et al. |
| 8,751,902 B2 | 6/2014 | Jin et al. |
| 9,362,956 B2 | 6/2016 | Mahdavifar et al. |
| 9,479,375 B1 | 10/2016 | Ankarali et al. |
| 9,667,381 B2 | 5/2017 | Jeong et al. |
| 9,692,451 B2 | 6/2017 | Vasista et al. |
| 9,917,675 B2 | 3/2018 | Kudekar et al. |
| 2002/0147954 A1 | 10/2002 | Shea |
| 2003/0033575 A1 | 2/2003 | Richardson et al. |
| 2003/0123409 A1 | 7/2003 | Kwak et al. |
| 2004/0187129 A1 | 9/2004 | Richardson |
| 2005/0078765 A1 | 4/2005 | Jeong et al. |
| 2005/0149842 A1 | 7/2005 | Kyung et al. |
| 2005/0283707 A1 | 12/2005 | Sharon et al. |
| 2006/0020868 A1 | 1/2006 | Richardson et al. |
| 2006/0020872 A1 | 1/2006 | Richardson et al. |
| 2006/0184855 A1 | 8/2006 | Wang et al. |
| 2007/0113148 A1 | 5/2007 | Hong et al. |
| 2008/0178065 A1 | 7/2008 | Khandekar et al. |
| 2008/0207120 A1 | 8/2008 | Kurina et al. |
| 2009/0158129 A1 | 6/2009 | Myung et al. |
| 2009/0204868 A1 | 8/2009 | Park et al. |
| 2009/0217129 A1 | 8/2009 | Myung et al. |
| 2009/0300461 A1 | 12/2009 | Shor et al. |
| 2010/0023834 A1 | 1/2010 | Richardson et al. |
| 2010/0077275 A1 | 3/2010 | Yu et al. |
| 2010/0107033 A1 | 4/2010 | Kuri et al. |
| 2010/0185926 A1 | 7/2010 | Lawson et al. |
| 2010/0211844 A1 | 8/2010 | Yuda et al. |
| 2010/0257425 A1 | 10/2010 | Yue et al. |
| 2011/0047433 A1 | 2/2011 | Abu-Surra et al. |
| 2011/0066916 A1 | 3/2011 | Abu-Surra et al. |
| 2012/0084625 A1 | 4/2012 | Pisek et al. |
| 2012/0166917 A1 | 6/2012 | El-Khamy et al. |
| 2012/0240001 A1 | 9/2012 | Abu-Surra et al. |
| 2012/0317461 A1 | 12/2012 | Hwang et al. |
| 2013/0117344 A1 | 5/2013 | Gross et al. |
| 2014/0019820 A1* | 1/2014 | Vardy ................ H03M 13/13 714/752 |
| 2014/0040214 A1 | 2/2014 | Ma et al. |
| 2014/0201592 A1 | 7/2014 | Shen et al. |
| 2014/0229788 A1 | 8/2014 | Richardson |
| 2014/0229789 A1 | 8/2014 | Richardson |
| 2014/0304574 A1 | 10/2014 | Seo et al. |
| 2014/0365842 A1 | 12/2014 | Li et al. |
| 2014/0365845 A1 | 12/2014 | Pantelias et al. |
| 2015/0188666 A1 | 7/2015 | Mahdavifar et al. |
| 2015/0229337 A1 | 8/2015 | Alhussien et al. |
| 2015/0381208 A1 | 12/2015 | Li et al. |
| 2016/0013810 A1 | 1/2016 | Gross et al. |
| 2016/0013931 A1 | 1/2016 | Pisek et al. |
| 2016/0087648 A1 | 3/2016 | Korb et al. |
| 2016/0164537 A1 | 6/2016 | Pisek et al. |
| 2016/0164629 A1 | 6/2016 | Ahn et al. |
| 2016/0173132 A1 | 6/2016 | Cho |
| 2016/0380763 A1 | 12/2016 | Ahn et al. |
| 2017/0047947 A1 | 2/2017 | Hong et al. |
| 2017/0141798 A1 | 5/2017 | Kudekar et al. |
| 2017/0222663 A1 | 8/2017 | Parthasarathy et al. |
| 2017/0331494 A1 | 11/2017 | Richardson et al. |
| 2017/0331497 A1 | 11/2017 | Richardson et al. |
| 2017/0353267 A1 | 12/2017 | Kudekar et al. |
| 2017/0353269 A1 | 12/2017 | Lin et al. |
| 2017/0359086 A1 | 12/2017 | Kudekar et al. |
| 2017/0359148 A1 | 12/2017 | Richardson et al. |
| 2018/0034593 A1 | 2/2018 | Xu et al. |
| 2018/0226992 A1 | 8/2018 | Panteleev et al. |
| 2018/0358984 A1 | 12/2018 | Richardson et al. |
| 2018/0367245 A1 | 12/2018 | Soriaga et al. |

FOREIGN PATENT DOCUMENTS

| | | |
|---|---|---|
| CN | 103746708 A | 4/2014 |
| CN | 105227189 A | 1/2016 |
| CN | 105337696 A | 2/2016 |
| EP | 1601109 A2 | 11/2005 |
| EP | 2091171 A2 | 8/2009 |
| EP | 2096760 A1 | 9/2009 |
| EP | 2899912 A1 | 7/2015 |
| EP | 3264611 A1 | 1/2018 |
| WO | WO-2017209837 A1 | 12/2017 |
| WO | WO-2018128560 A1 | 7/2018 |

OTHER PUBLICATIONS

Chen B., et al., "List Viterbi Algorithms for Continuous Transmission", IEEE Transactions on Communications, vol. 49 No. 5, XP011009921, May 1, 2001, pp. 784-792.

Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].

Deng X., et al., "Segmented Cyclic Redundancy Check: A Data Protection Scheme for Fast Reading RFID Tag's Memory," IEEE Wireless Communications and Networking Conference, 2008, pp. 1576-1581.

El-Khamy M., et al., "Binary Polar Codes are Optimized Codes for Bitwise Multistage Decoding", Arxiv.org, Cornell University Library, 201 Olin Library Cornell University Ithaca, NY 14853, Apr. 13, 2016, XP080695103, DOI: 10.1049/EL.2016.0837, 2 pages.

Ericsson: "Performance and Complexity of Per-Segment CRC Attachment Methods" 3GPP DRAFT; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.
<span style="font-family: calibri;">Guo J., et al., "Multi-CRC Polar Codes and Their Applications", IEEE Communications Letters,< span style="font-family: calibri;">Feb. 2016, vol. 20, No. 2, pp. 212-215.

Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].

(56) References Cited

OTHER PUBLICATIONS

International Search Report and Written Opinion, PCT/US2017/025421, dated Mar. 31, 2017, International Search Authority—European Patent Office, dated Nov. 7, 2017, pp. 1-33.
Jun Lin et al., "A reduced latency list decoding algorithm for polar codes", 2014 IEEE Workshop on Signal Processing Systems (SIPS), Oct. 1, 2014, p. 1-6.
Lucas R et al., "Improved Soft-Decision Decoding of Reed-Muller Codes as Generalized Multiple Concatenated Codes", ITG-FACHBERI, vol. 183, VDE-VERLAG, DE, No. 146, Mar. 5, 1998, pp. 137-142.
Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Oct. 3, 2013].
Partial International Search Report—PCT/US2017/025421—ISA/EPO—dated Jul. 10, 2017.
Stolte N., Rekursive Codes mit der Plotkin-Konstruktion und ihre Decodierung, D17 Darmstadter Dissertation, Jan. 1, 2002, 151 pages, (in particular, pp. 13-30), XP055241445, URL:http:l/tuprints.ulb.tu-darmstadt.de/epda/000183/stolte.pdf, Techn. Universitat, Diss., 2002 (Nicht f. d. Austausch)___Darmstadt [retrieved on Jan. 14, 2016].
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.
Trifonov P., et al., "Generalized Concatenated Codes based on Polar Codes", 8th International Symposium on Wireless Communication Systems, Nov. 6, 2011, XP032090122, pp. 442-446, DOI: 10.1109/ISWCS.2011.6125399, ISBN: 978-1-61284-403-9.
Trifonov P., et al., "Fast Encoding of Polar Codes with Reed-Solomon Kernel," IEEE Transactions on Communications, May 2016, pp. 1-8.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].
Wang Y., et al., "Concatenations of Polar Codes With Outer BCH Codes and Convolutional Codes", 2014 52nd Annual Allerton Conference on Communication, Control, and Computing (ALLERTON), Sep. 30, 2014, pp. 813-819, XP032731136, DOI: 10.1109/ALLERTON.2014.7028538 [retrieved on Jan. 30, 2015].
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].
Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.
Alcatel-Lucent et al., "LDPC Coding Proposal for LBC", 3GPP2 DRAFT; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,Feb. 26, 2007/ pp. 1-27.
Alcatel-Lucent et al., "LDPC Coding Proposal for LBC", 3GPP2-DRAFTS, 2500 Wilson Boulevard, Suite 300, Arlington, Virginia 22201, USA, Mar. 15, 2007, XP040477608, 32 pages.
Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.

El-Khamy M., et al., "Design of Rate Compatible Structured LDPC Codes for Hybrid ARQ Applications", IEEE, Aug. 1, 2009, vol. 27(6), pp. 965-973.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; 20170213-20170217, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
IEEE: "IEEEStd 802.16e-2005, Air Interface for Fixed and Mobile Broadband Wireless Access Systems," Amendment 2 and Corrigendum 1 to IEEE Std 802.16-2004, IEEE STD 802.16E-2005, Feb. 28, 2006 (Feb. 28, 2006), pp. 626-630, XP002515198.
"IEEE Standard for Local and Metropolitan Area Networks Part 16: Air Interface for Broadband Wireless Access Systems; IEEE Std 802.16-2009 (Revision of IEEE Std 802.16-2004)", May 29, 2009, XP068045637, ISBN: 978-0-7381-5919-5, pp. 1-2080.
Jiang M., et al., "An Improved Variable Length Coding Scheme Using Structured LDPC Codes", IEEE, Oct. 1, 2010, 5 Pages.
Liu J., et al., "Rate-Compatible LDPC Codes with Short Block Lengths Based on Puncturing and Extension Techniques," 2014, pp. 1-20.
MEDIATEK Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Myung S., et al., "Extension of Quasi-cyclic LDPC Codes by Lifting," PROC ., IEEE International Symposium on Information Theory, ISIT 2005, Adelaide, Australia, Sep. 4, 2005 (Sep. 4, 2005),-Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
QUALCOMM Incorporated: "LDPC Codes—HARQ, Rate", 3GPP DRAFT; R1-162209, LDPC_RATECOMPATIBILITY_HIGHLEVELDESIGN, 3rd Generation Partnership Project (3GPP), Mobile Competence Centre, 650, Route Des Lucioles ; F06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
QUALCOMM Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].
Richardson T., et al., "Design of Low-Density Parity Check Codes for 5G New Radio," IEEE Communications Magazine, vol. 56 (3), Mar. 1, 2018, pp. 28-34, XP055480192.
Tal I., et al., "List Decoding of Polar Codes", IEEE Transactions on Information Theory, Institute of Electrical and Electronics Engineers, May 2015, vol. 61, No. 5, pp. 2213-2226.
Arikan E., "Challenges and some new directions in channel coding," Computer Science, Information Theory, arXiv:1504.03916, Apr. 15, 2015, 11 pages.
Leroux C., et al., "A Semi-Parallel Successive-Cancellation Decoder for Polar Codes," IEEE Transactions on Signal Processing, Jan. 2013, vol. 61, No. 2, pp. 1-11.
Mahdavifar H., et al., "Fast Multi-dimensional Polar Encoding and Decoding," Information Theory and Applications Workshop (ITA), IEEE, 2014, 5 pages.

(56) References Cited

OTHER PUBLICATIONS

Ericsson: "System Information for Low Complexity and Extended Coverage", 3GPP DRAFT; R1-1708730—SYSINFO for Low Complexity and EXT Coverage, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.

Nokia et al., "LDPC Design for eMBB", 3GPP DRAFT; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, WA, USA; Apr. 3, 2017-Apr. 7, 2017 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.

QUALCOMM Incorporated: "LDPC Rate Matching", 3GPP DRAFT; R1-1708640_LDPC RATE_MATCHING, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 14, 2017, XP051273827, Retrieved from the Internet: URL:http://www.3gpp.org/ftp/Meetings_3GPP_SYNC/RAN1/Docs/ [retrieved on May 14, 2017], 3 pages.

Surra S.A., et al., "Gigabit Rate Achieving Low-Power LDPC Codes: Design and Architecture", IEEE, Mar. 1, 2011, pp. 1994-1999.

Tal I., et al., "List Decoding of Polar Codes", IEEE Transactions on Information Theory, May 31, 2012, pp. 1-11.

Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.

ZTE: "Structured LDPC Coding with Rate Matching", 3GPP DRAFT; R1-060115, Mobile Competence Centre ; 650, Route Des Lucioles; F-06921 Sophia-Antipolis Cedex; France, vol. RAN WG1, No. Helsinki, Finland; Jan. 19, 2006, XP050950962, Retrieved from the Internet: URL:http://www.3gpp.org/ftp/tsg_ran/WG1_RL1/TSGR1_AH/LTE_AH_0601/Docs/, 13 pages.

Chapter II Demand and Amendment under PCT Article 34 as filed Apr. 2, 2018, PCT/US2017/035026.

Mackay D.J.C., "Good Error-Correcting Codes Based on Very Sparse Matrices," IEEE Transactions on Information Theory, Mar. 1999, vol. 45 (2), pp. 399-431.

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

Shea J.M., et al., "Multidimensional Codes" In: "Wiley Encyclopedia of Telecommunications," Jan. 1, 2003, vol. 3, pp. 1538-1551, XP055402230.

Shi L., "Research on Polar Code Characters and its Encoding and Decoding Method", Chinese Master's Theses Full-Text Database, Information Science and Technology, Issue No. 12, Dec. 15, 2015.

Mar. 26, 2019 CNIPA Office Action for CN application No. 201780033491.1.

* cited by examiner

ENHANCED POLAR CODE CONSTRUCTIONS BY STRATEGIC PLACEMENT OF CRC BITS

CLAIM OF PRIORITY UNDER 35 U.S.C. § 120

This application is a continuation of U.S. application Ser. No. 15/395,713, filed Dec. 30, 2016, which claims priority to and benefit of U.S. Provisional Patent Application Ser. No. 62/344,031, filed Jun. 1, 2016, each of which is herein incorporated by reference in its entirety as if fully set forth below and for all applicable purposes.

TECHNICAL FIELD

The technology discussed below generally relates to wireless communications and, more particularly, to a method and apparatuses for improving decoding latency and performance of Polar codes, for example, by strategic placement of CRC bits. Embodiments enable and provide coding techniques that can be used on varying sizes of data packets and may be used for control/data channels as desired.

INTRODUCTION

In a transmitter of all modern wireless communication links, an output sequence of bits from an error correcting code can be mapped onto a sequence of complex modulation symbols. These symbols can be then used to create a waveform suitable for transmission across a wireless channel. As data rates increase, decoding performance on the receiver side can be a limiting factor to achievable data rates. Data coding remains important to continued wireless communication enhancement.

BRIEF SUMMARY

Certain aspects of the present disclosure provide techniques and apparatuses for improving wireless communications, decoding latency, and performance related to Polar codes.

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects provide a method for wireless communications. The method generally includes generating a codeword by encoding information bits, using a multi-dimensional interpretation of a polar code of length N, determining, based on one or more criteria, a plurality of locations within the codeword to insert error correction codes, generating the error correction codes based on corresponding portions of the information bits, inserting the error correction codes at the determined plurality of locations, and transmitting the codeword.

Certain aspects provide an apparatus for wireless communications. The apparatus generally includes at least one processor configured to generate a codeword by encoding information bits, using a multi-dimensional interpretation of a polar code of length N, determine, based on one or more criteria, a plurality of locations within the codeword to insert error correction codes, generate the error correction codes based on corresponding portions of the information bits, insert the error correction codes at the determined plurality of locations, and transmit the codeword. The apparatus also generally includes a memory coupled with the at least one processor as well as a communication interface for wireless communication Certain aspects provide an apparatus for wireless communications. The apparatus generally includes means for generating a codeword by encoding information bits, using a multi-dimensional interpretation of a polar code of length N, means for determining, based on one or more criteria, a plurality of locations within the codeword to insert error correction codes, means for generating the error correction codes based on corresponding portions of the information bits, means for inserting the error correction codes at the determined plurality of locations, and means for transmitting the codeword.

Certain aspects provide a non-transitory computer-readable medium for wireless communications. The non-transitory computer-readable medium generally includes code for generating a codeword by encoding information bits, using a multi-dimensional interpretation of a polar code of length N, determining, based on one or more criteria, a plurality of locations within the codeword to insert error correction codes, generating the error correction codes based on corresponding portions of the information bits, inserting the error correction codes at the determined plurality of locations, and transmitting the codeword.

Certain aspects provide a method for wireless communications. The method generally includes receiving a codeword generated by encoding information bits using a multi-dimensional interpretation of a polar code of length N, decoding portions of the codeword, and verifying the decoded portions of the codeword based on error correction codes inserted, based on one or more criteria, at a plurality of locations in the codeword.

Certain aspects provide an apparatus for wireless communications. The apparatus generally includes at least one processor configured to receive a codeword generated by encoding information bits using a multi-dimensional interpretation of a polar code of length N, decode portions of the codeword, and verify the decoded portions of the codeword based on error correction codes inserted, based on one or more criteria, at a plurality of locations in the codeword.

Certain aspects provide an apparatus for wireless communications. The apparatus generally includes means for receiving a codeword generated by encoding information bits using a multi-dimensional interpretation of a polar code of length N, means for decoding portions of the codeword, and means for verifying the decoded portions of the codeword based on error correction codes inserted, based on one or more criteria, at a plurality of locations in the codeword.

Certain aspects provide a non-transitory computer-readable medium for wireless communications. The non-transitory computer-readable medium generally includes code for receiving a codeword generated by encoding information bits using a multi-dimensional interpretation of a polar code of length N, decoding portions of the codeword, and verifying the decoded portions of the codeword based on error correction codes inserted, based on one or more criteria, at a plurality of locations in the codeword.

Certain aspects provide a method for wireless communications. The method generally includes generating a codeword by encoding information bits using a first code of length K to obtain bits for transmission via K channels, wherein the first code comprises a polar code, further encoding the bits in each of the K channels using a second code of length M, and transmitting the codeword.

Certain aspects provide an apparatus for wireless communications. The apparatus generally includes at least one processor configured to generate a codeword by encoding information bits using a first code of length K to obtain bits for transmission via K channels, wherein the first code comprises a polar code and further encode the bits in each of the K channels using a second code of length M. The apparatus also generally includes a transmitter configured to transmit the codeword. Additionally, the apparatus also generally includes a memory coupled with the at least one processor.

Certain aspects provide an apparatus for wireless communications. The apparatus generally includes means for generating a codeword by encoding information bits using a first code of length K to obtain bits for transmission via K channels, wherein the first code comprises a polar code, means for further encoding the bits in each of the K channels using a second code of length M, and means for transmitting the codeword.

Certain aspects provide a non-transitory computer-readable medium for wireless communications. The non-transitory computer-readable medium generally includes instructions for generating a codeword by encoding information bits using a first code of length K to obtain bits for transmission via K channels, wherein the first code comprises a polar code, further encoding the bits in each of the K channels using a second code of length M, and transmitting the codeword.

Certain aspects provide a method for wireless communications. The method generally includes receiving a codeword corresponding to information bits encoded using a first code of length K to obtain bits for transmission via K channels and a second code of length M to further encode the bits in each of the K channels, wherein the first code comprises a polar code, and decoding the codeword using successive list (SC) decoding Certain aspects provide an apparatus for wireless communications. The apparatus generally includes at least one processor configured to receive a codeword corresponding to information bits encoded using a first code of length K to obtain bits for transmission via K channels and a second code of length M to further encode the bits in each of the K channels, wherein the first code comprises a polar code, and decode the codeword using successive list (SC) decoding.

Certain aspects provide an apparatus for wireless communications. The apparatus generally includes means for receiving a codeword corresponding to information bits encoded using a first code of length K to obtain bits for transmission via K channels and a second code of length M to further encode the bits in each of the K channels, wherein the first code comprises a polar code, and means for decoding the codeword using successive list (SC) decoding.

Certain aspects provide a non-transitory computer-readable medium for wireless communications. The non-transitory computer-readable medium generally includes code for receiving a codeword corresponding to information bits encoded using a first code of length K to obtain bits for transmission via K channels and a second code of length M to further encode the bits in each of the K channels, wherein the first code comprises a polar code, and decoding the codeword using successive list (SC) decoding.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
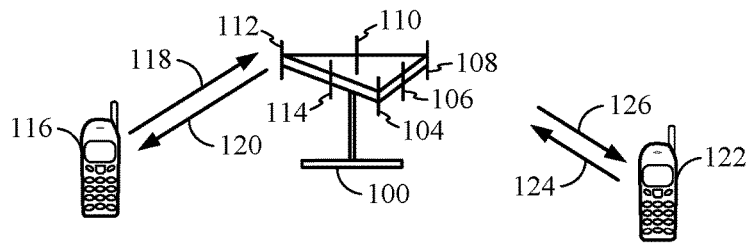
FIG. 1 illustrates an example wireless communication system in accordance with certain aspects of the present disclosure.

Polar codes are the first provably capacity-achieving coding scheme with almost linear (in block length) encoding and decoding complexity. However, a main drawback of using polar codes is the finite-length performance and decoder latency. Certain aspects of the present disclosure provide techniques and apparatuses for improving wireless communications, decoding latency, and performance related to Polar codes. For example, in some cases, improving performance an reducing latency of list SC decoding may involve selectively inserting error correction codes (e.g., CRCs) at different locations within a polar code codeword, while in other cases, improving performance an reducing latency of list SC decoding may involve encoding information bits first using a polar code and then further encoding the polar-encoded bits using a non-polar code, for example, as described in greater detail below.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, a sensor/industrial equipment, a medical device, an automobile/vehicle, a human implantable device, wearables, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point 100 (AP) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
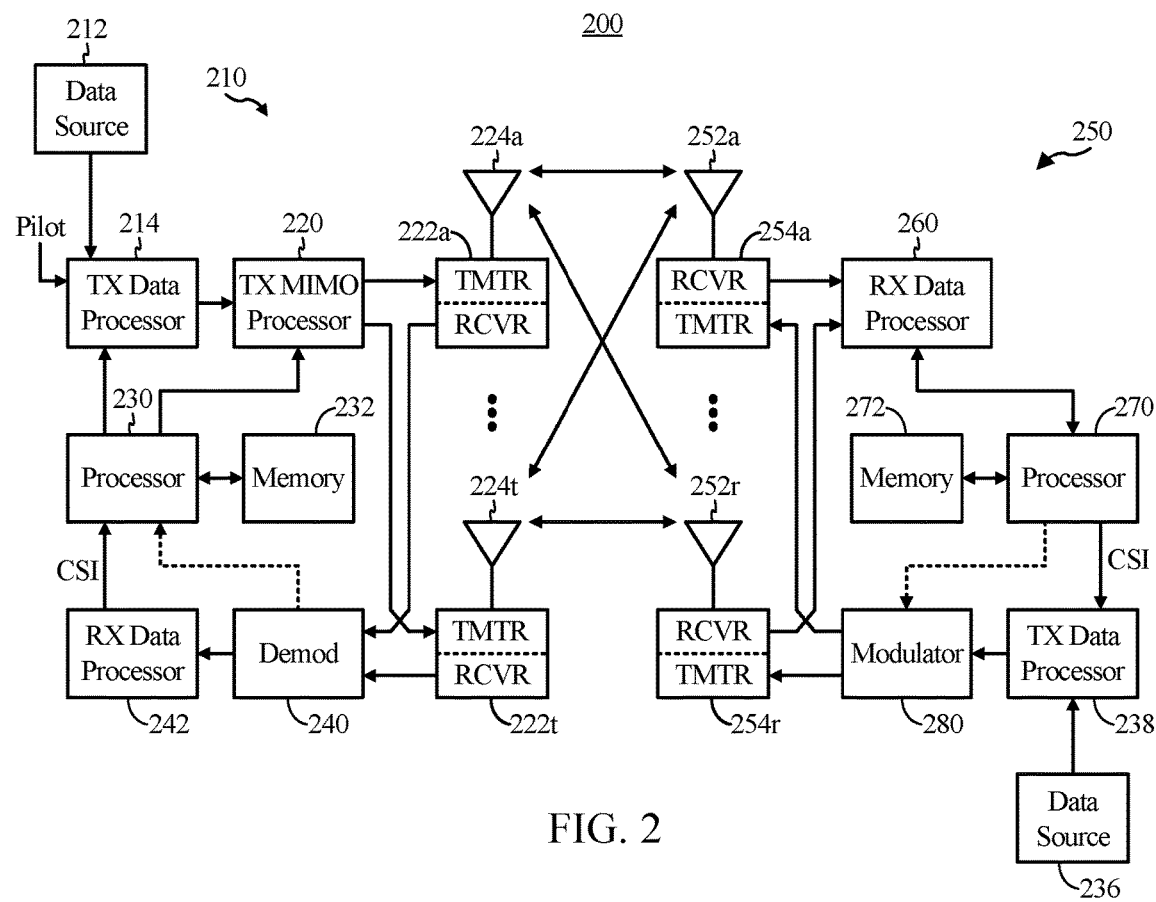
FIG. 2 illustrates a block diagram of an access point and a user terminal in accordance with certain aspects of the present disclosure.

FIG. 2 illustrates a block diagram of an aspect of a transmitter system 210 (e.g., also known as the access point) and a receiver system 250 (e.g., also known as the access terminal) in a wireless communications system, for example, a MIMO system 200. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
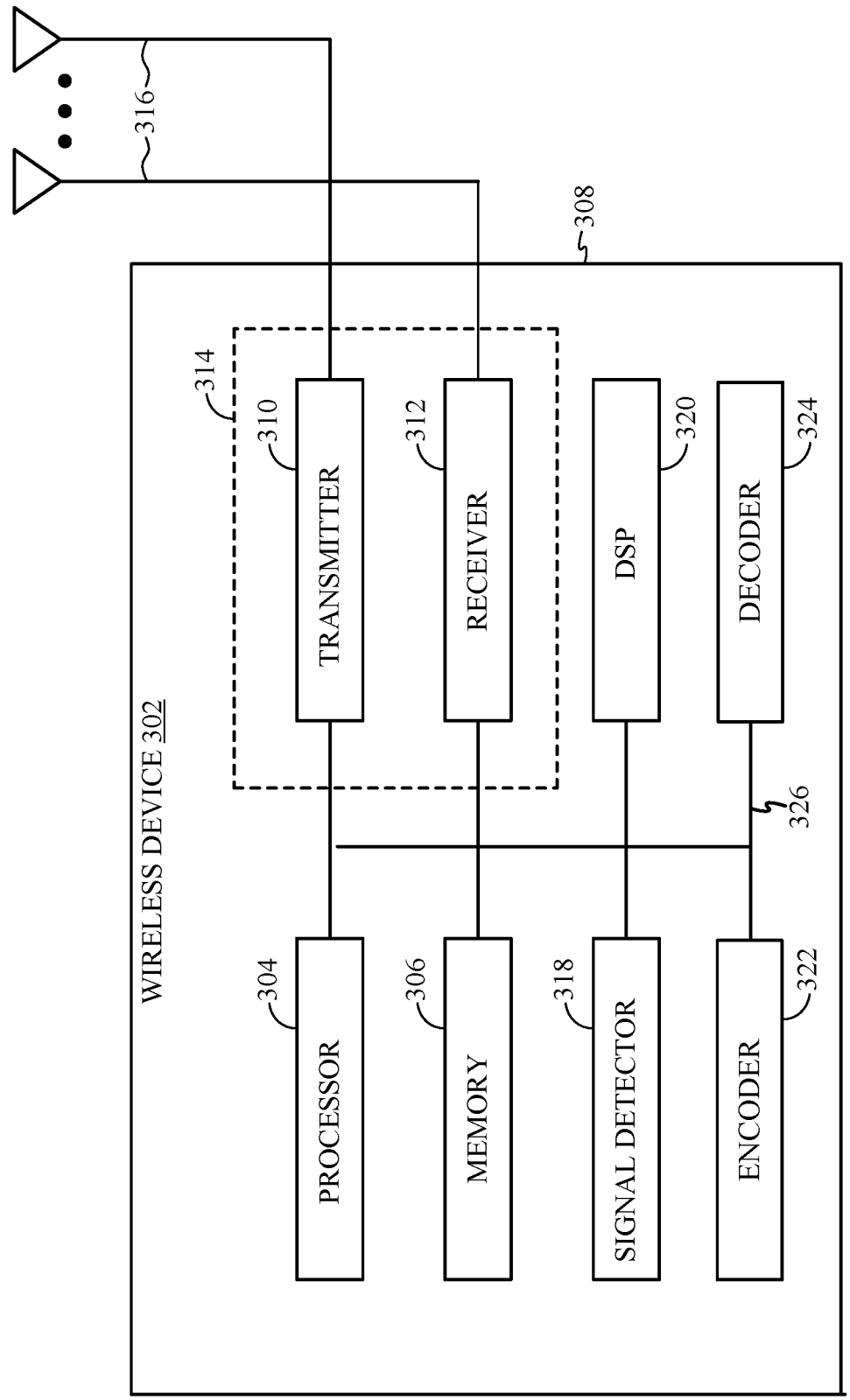
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. The wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission (e.g., by implementing operations 600 and/or 1000) and a decoder 324 for use in decoding received signals (e.g., by implementing operations 700 and/or 1100).

The various components of the wireless device 302 may be coupled together by a bus system 326, which may include a power bus, a control signal bus, and a status signal bus in addition to a data bus. The processor 304 may be configured to access instructions stored in the memory 306 to perform connectionless access, in accordance with aspects of the present disclosure discussed below.

Figure 4:
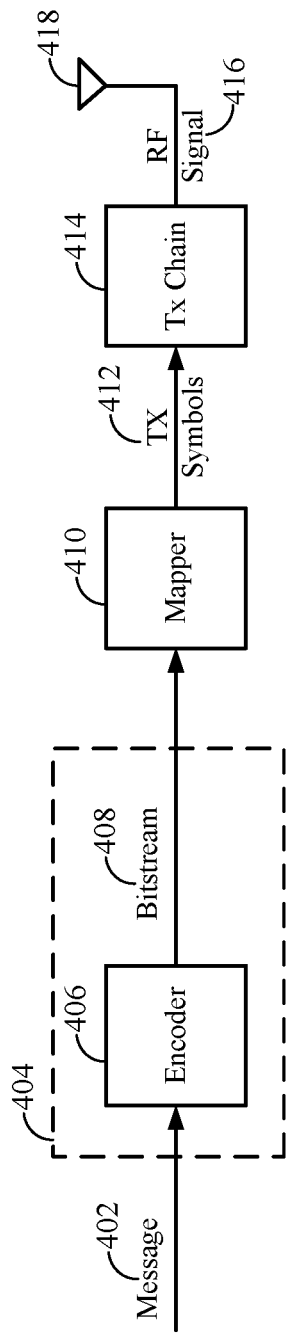
FIG. 4 is a simplified block diagram illustrating a decoder, in accordance with certain aspects of the present disclosure.

FIG. 4 is a simplified block diagram illustrating an encoder, in accordance with certain aspects of the present disclosure. FIG. 4 illustrates a portion of a radio frequency (RF) modem 404 that may be configured to provide an encoded message for wireless transmission. In one example, an encoder 406 in a base station (e.g., access point 100 and/or transmitter system 210) (or an access terminal on the reverse path) receives a message 402 for transmission. The message 402 may contain data and/or encoded voice or other content directed to the receiving device. The encoder 406 encodes the message using a suitable modulation and coding scheme (MCS), typically selected based on a configuration defined by the access point 100/transmitter system 210 or another network entity. In some cases, the encoder 406 may encode the message using techniques described below (e.g., by implementing operations 600 and/or 1000 described below). An encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
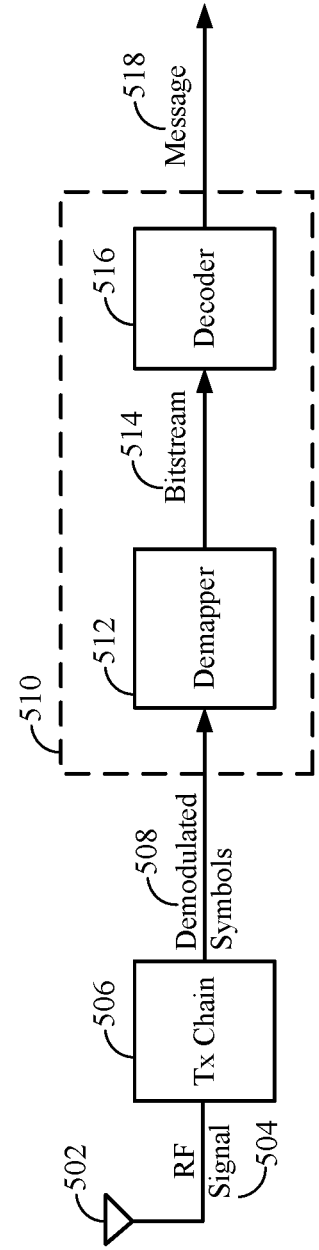
FIG. 5 is a simplified block diagram illustrating a decoder, in accordance with certain aspects of the present disclosure.

FIG. 5 is a simplified block diagram illustrating a decoder, in accordance with certain aspects of the present disclosure. FIG. 5 illustrates a portion of a RF modem 510 that may be configured to receive and decode a wirelessly transmitted signal including an encoded message (e.g., a message encoded using a polar code as described below). In various examples, the modem 510 receiving the signal may reside at the access terminal, at the base station, or at any other suitable apparatus or means for carrying out the described functions. An antenna 502 provides an RF signal 416 (i.e., the RF signal produced in FIG. 4) to an access terminal (e.g., access terminal 116, 122, and/or 250). An RF chain 506 processes and demodulates the RF signal 416 and may provide a sequence of symbols 508 to a demapper 512, which produces a bitstream 514 representative of the encoded message.

A decoder 516 may then be used to decode m-bit information strings from a bitstream that has been encoded using a coding scheme (e.g., a Polar code). The decoder 516 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., access point 100 and/or transmitter system 210). The decoder may decode the bitstream 514 in accordance with aspects of the present disclosure presented below (e.g., by implementing operations 700 and/or 1100 described below).

Example Enhanced Polar Code Constructions by Strategic Placement of CRC Bits

Polar codes are the first provably capacity-achieving coding scheme with almost linear (in block length) encoding and decoding complexity. Polar codes are widely considered as a candidate for error-correction in the next-generation wireless systems. Polar codes have many desirable properties such as deterministic construction (e.g., based on a fast Hadamard transform), very low and predictable error floors, and simple successive-cancellation (SC) based decoding.

However, a main drawback of using polar codes is the finite-length performance and decoder latency. For example, polar codes have a minimum distance which grows with the square-root of the block-length and hence the SC decoding error does not fall exponentially fast in the block-length. Furthermore, the SC decoder is inherently serial and this results in a large decoding latency.

In some cases, to improve their error-exponents, polar codes are concatenated with a cyclic redundancy check (CRC). This concatenated code has improved minimum distance and, when combined with the list SC decoder, the performance improves considerably. However, one disadvantage that still remains is the latency of the decoder. Furthermore, energy spent on the CRC encoding could prove expensive for short-to-medium block-lengths.

Thus, aspects of the present disclosure provide several improvements on the basic scheme of polarization which may result in improved performance as well as improved latency of the list SC decoding. For example, in some cases, improving performance an reducing latency of list SC decoding may involve using a distributed parity check where error correction codes (e.g., CRCs) are selectively inserted at different locations within a polar code codeword, while in other cases, improving performance an reducing latency of list SC decoding may involve encoding information bits first using a polar code and then further encoding the polar-encoded bits using a non-polar code.

Figure 6:
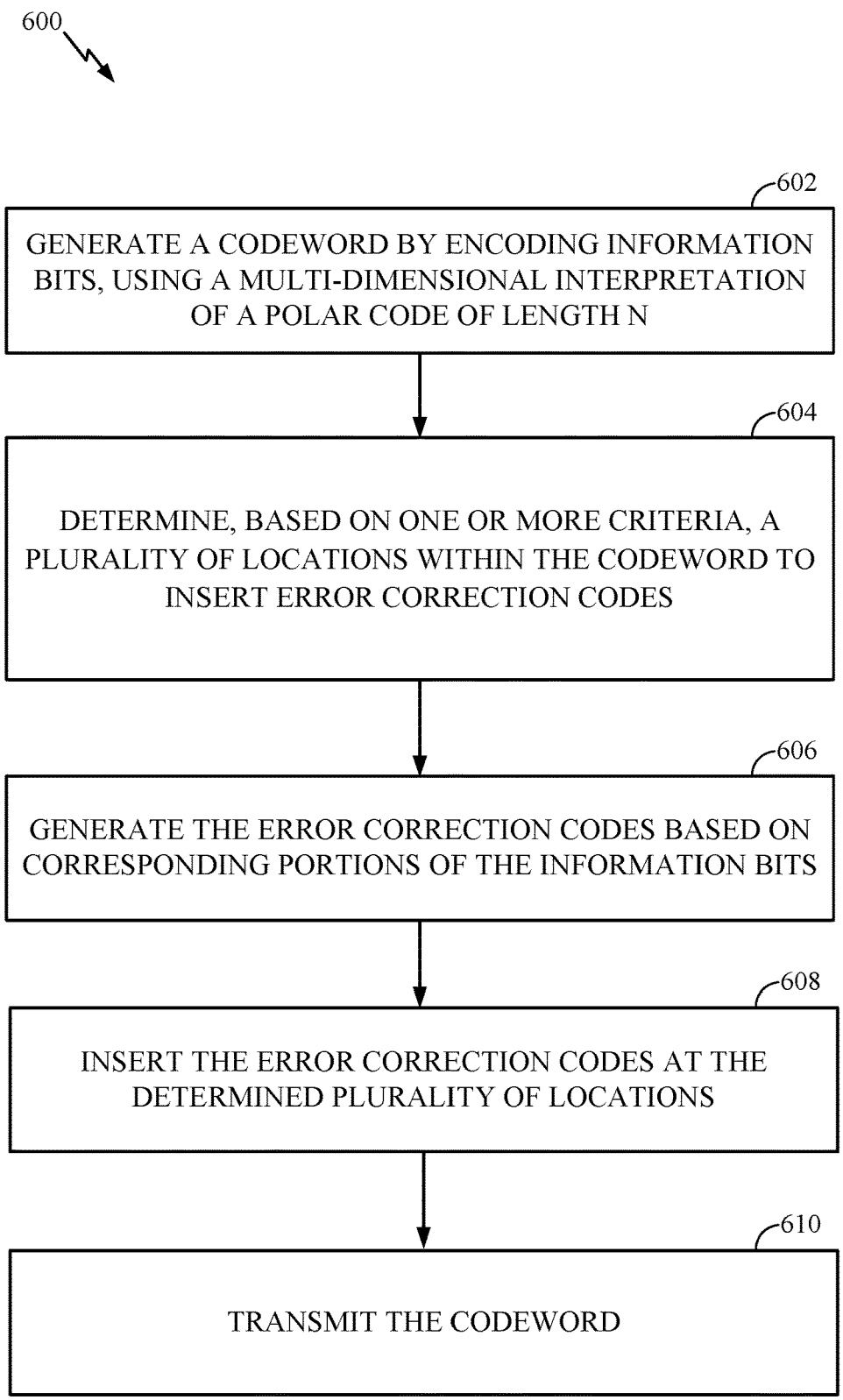
FIG. 6 illustrates example operations for wireless communications by a base station (BS), in accordance with certain aspects of the present disclosure.

FIG. 6 illustrates example operations 600 for wireless communication, in accordance with certain aspects of the present disclosure. According to certain aspects, operations 600 may be performed by a base station (BS) (e.g., access point 100/transmitter system 210). It should be noted that, while operations 600 are described as being performed by a base station, operations 600 could also be performed by a user equipment (UE) (access terminal 116). In other scenarios, aspects can be used by devices capable of acting like both UEs/BSs in a hybrid fashion as well as in virtual settings (such as SDN/NFV scenarios).

Operations 600 begin at 602, by generating a codeword by encoding information bits, using a multi-dimensional interpretation of a polar code of length N. At 604, the BS determines, based on one or more criteria, a plurality of locations within the codeword to insert error correction codes Such placement may be termed a distributed parity check and/or strategic CRC insertion. At 606, the BS generates the error correction codes based on corresponding portions of the information bits (i.e., a set of information bits occurring before the error correction code). At 608, the BS inserts the error correction codes at the determined plurality of locations. At 610, the BS transmits the codeword, for example, using one or more transmitters (e.g., TMTR 222) and one or more antennas (e.g., one or more antennas 224). It should be understood that the codeword can be transmitted in different ways, such as transmitted over a hardwire line or over a wireless medium, or stored in a computer-readable medium (e.g., a compact disk, USB drive), etc.

Figure 7:
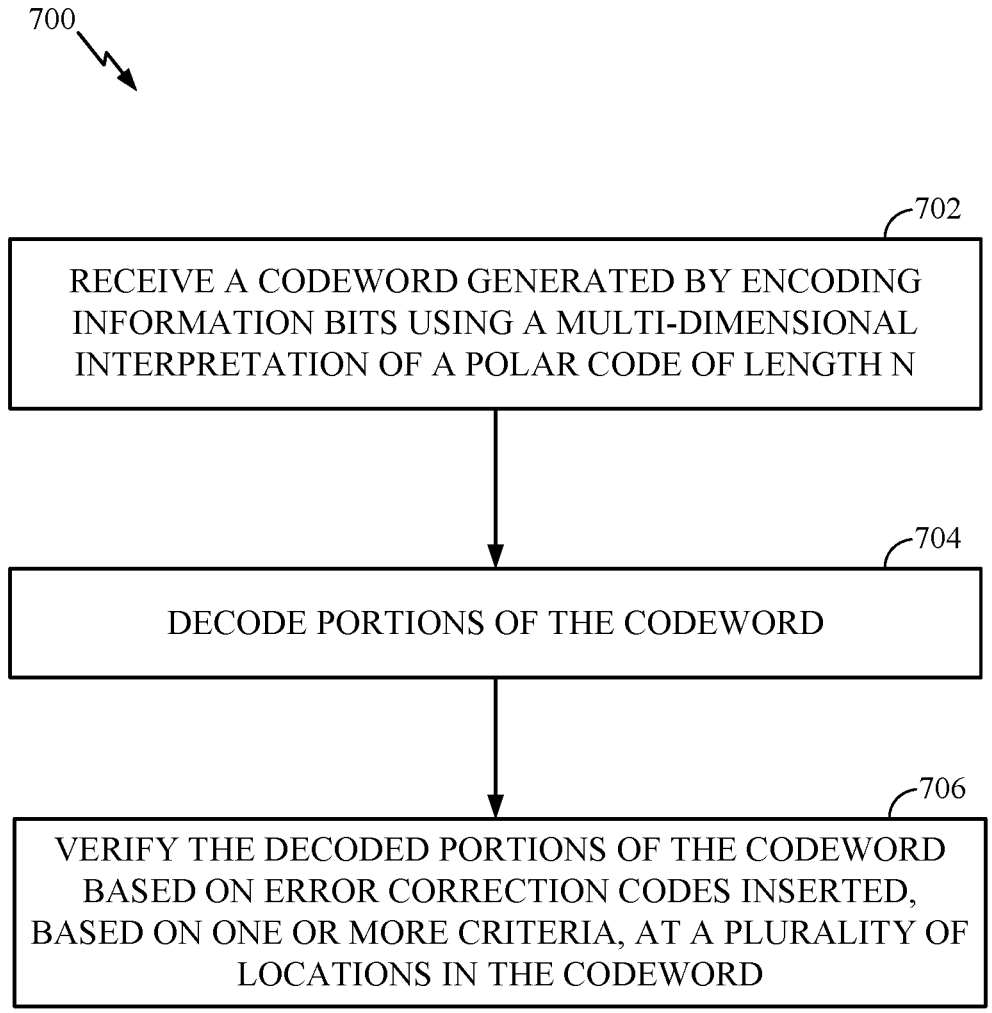
FIG. 7 illustrates example operations for wireless communications by a user equipment (UE), in accordance with certain aspects of the present disclosure

FIG. 7 illustrates example operations 700 for wireless communication, in accordance with certain aspects of the present disclosure. Operations 700 may be performed, for example, by a user equipment (UE) (e.g., access terminal 116/receiver system 250). It should be noted that, while operations 700 are described as being performed by a UE, operations 700 could also be performed by a base station (e.g., access point 100). In other scenarios, aspects can be used by devices capable of acting like both UEs/BSs in a hybrid fashion as well as in virtual settings (such as SDN/NFV scenarios).

Operations 700 begin at 702, by receiving a codeword generated by encoding information bits using a multi-dimensional interpretation of a polar code of length N. It should be understood that the codeword can be received in different ways, such as received over a hardwire line or over a wireless medium, or from a computer-readable medium (e.g., a compact disk, USB drive), etc. At 704, the UE decodes portions of the codeword. At 706, the UE verifies the decoded portions of the codeword based on error correction codes inserted, based on one or more criteria, at a plurality of locations in the codeword.

As noted above, polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G_n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

According to certain aspects, a codeword may be generated (e.g., by a BS) by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be transmitted by the base station over a wireless medium and received by a UE.

When the received vectors are decoded (e.g., by the UE) using a Successive Cancellation (SC) decoder, every estimated bit, u has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N−K) bits to a predetermined value, such as 0, for example as explained below.

For very large N, polar codes transform the channel into N parallel "virtual" channels for the N information bits. If C is the capacity of the channel, then there are almost N*C channels which are completely noise free and there are N(1−C) channels which are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

Figure 8:
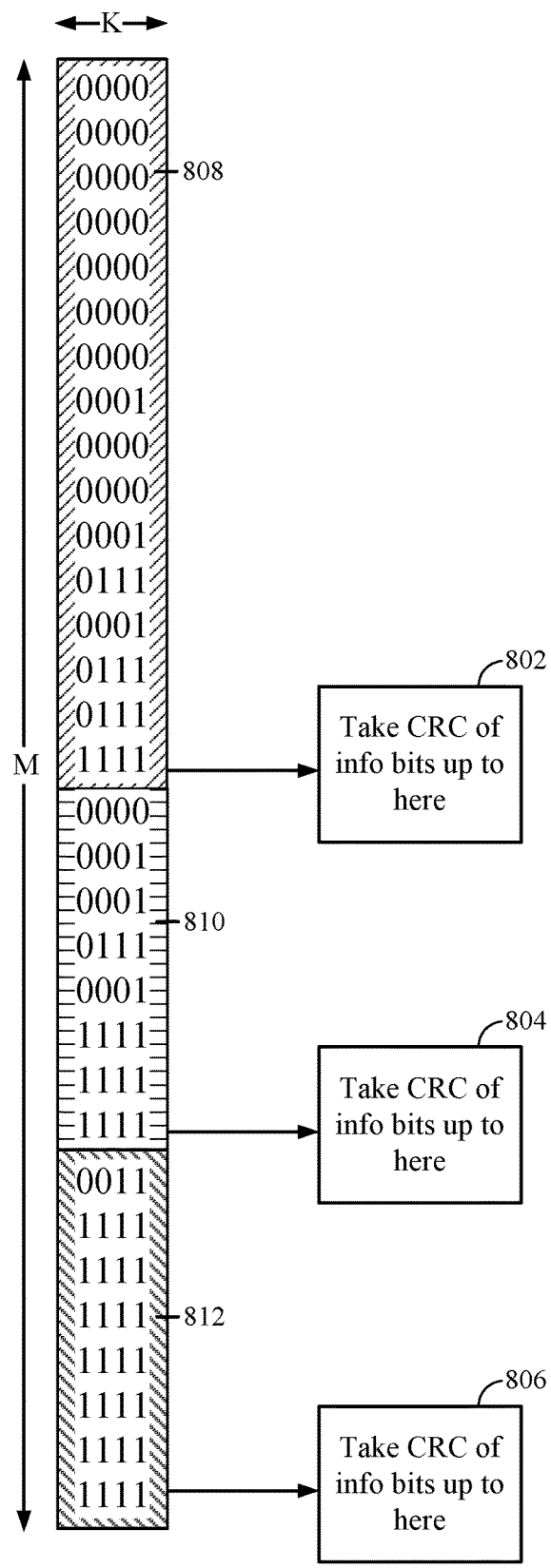
FIG. 8 illustrates a two-dimensional polar code, in accordance with certain aspects of the present disclosure.

According to certain aspects, to reduce complexity, polar codes may be represented in two dimensions. For example, let N=K×M, where K, M are powers of 2 (denote the exponent by k, m respectively). For example, FIG. 8 illustrates a polar code of size N=128, rearranged in two-dimensions, having four columns (K=4) and thirty-two rows (M=32). According to certain aspects, the rate of the code illustrated in FIG. 8 is ½. Information bits may be placed at the position corresponding to a '1' and no information is placed in the position corresponding to a '0'. Polarization may then first be performed in the $2^{nd}$ dimension, for example, by using the Hadamard matrix $G^m$ (i.e., the inner code). For example, to determine the codeword, polarization along any column (e.g., Hadamard matrix of size M=32) may first be considered. This gives rise to M channels some of which are "bad", some of which are "good" and some are in the "transition". Now each of these M channels may be further polarized using the Hadamard matrix $G^k$ (e.g., Hadamard matrix of size K=4). This results in the same polar code as if we had used the Hadamard matrix $G^n$. That is, for the example illustrated in FIG. 8, this gives us exactly the same channels as if we polarized with a Hadamard matrix of size 128. Note that the successive-cancellation (SC) decoder proceeds from top to bottom and from left to the right. (i.e., start at first row (left to the right) and then proceed to the next row (left to the right) and so on so forth). Thus, in essence $G^n$ has been factored in tensor form.

Certain aspects of the present disclosure propose to use this 2-dimensional form to represent and modify Polar codes so as to achieve several benefits such as lower decoding latency and potentially better performance.

For example, typically, when error correction codes (e.g., CRC codes) are concatenated with a Polar code, the CRC is taken at the very end of the decoding process. However, sometimes due to some "bad" channels in that are used for transmission, the correct decoding path can fall of the decoding list maintained by the decoder somewhere in the middle of the decoding process which results in an error, known as a block error rate. Thus, to help alleviate this problem, CRC may be performed by a UE at regular intervals (e.g., known a priori at the decoder in the UE) rather than just at the end so that the correct path is kept for a longer time in the decoding list and thus improve performance.

According to certain aspects, a base station may determine a partition of the information bits, as explained below, so that a UE may perform CRC for each partition. For example, a decoder in the UE may know the positions where the CRC bits are placed and the CRC is taken for the partition of previously decoded information bits. According to aspects, taking the CRC during regular intervals could ensure that the correct decoding path stays within the list.

According to certain aspects, the two-dimensional view of the Polar code offers a way to do this. For example, a base station may identify a few of the channels within the transition in which the base station may place the CRC bits. More precisely, the base station may determine the columns of the generator matrix which represent all or few of the channels in the transition. The base station may then use the CRC bits to encode the information sent on the "good" polarized channels (of these channels in transition). This would ensure better performance and complexity compared to standard list SC decoding with CRC at the end.

An example of this technique is shown in FIG. 8. According to certain aspects, the rate 1 row-wise block codes (e.g., 1111) can cause a proliferation of the paths which may be pruned by taking the CRC as shown in FIG. 8. In some cases, CRC may need to be performed more often than the standard scheme (i.e., more than once at the end of decoding). However, the coding gain from taking the CRC more often would be able to more than compensate for the loss in energy per information bit. This would be due to more CRCs for the same list size as the standard scheme and/or may also achieve the same performance as the standard scheme yet with a lower list size. The latter would be beneficial to attain lower implementation complexity and decoding latency thereby enabling more efficient overall communication (e.g., in both power and time).

According to certain aspects, this would be a transmitter side scheme which would enable list SC decoding of Polar+ CRC code with lower complexity by reducing the list size yet obtaining the same performance as the standard list SC decoding with a larger list size. That is, for example, as noted above, to reduce decoding complexity, the BS may determine a plurality of locations within a codeword to insert CRC codes, for example, based on one or more criteria (e.g., locations of rate 1 row-wise block codes within a code word and/or where a correct decoding path typically falls the decoding list) as explained below.

For example, as illustrated in FIG. 8, the base station may determine these locations (e.g., 802, 804, and 806) by looking at the different row-wise block codes within the polar code. For example, in some cases, the base station may look for the first location (e.g., a row) in the polar code that has a rate 1 row-wise block code (e.g., at 802) and may insert the CRC bits, covering all of the rows leading up to the row with the rate 1 row-wise block code (e.g., portion 808), at this location. For example, the base station may determine to insert CRC bits covering all of the rows leading up to the row with the rate 1 row-wise block code since rate one block-codes will proliferate the decoding list and create a lot of paths. For example, as illustrated, CRC location 802 may cover the portion 808 of the polar code, CRC location 804 may cover the portion 810 of the polar code, and CRC location 806 may cover the portion 812 of the polar code. In some cases, the CRC bits for a particular portion may cover the bits within that portion and also the bits in a previous portion. For example, the CRC bits placed at location 804 may cover the portion 810 as well as the portion 808. According to aspects, inserting CRC bits at these points can reduce the number of list elements in the decoding path and help ensure that the correct decoding path (e.g., at the UE) remains in the decoding list.

In other cases, the base station may determine the locations to place the CRC bits based on a statistical analysis of at what points the correct decoding path typically falls off the decoding list. For example, the base station and/or UE may receive information regarding a variety of parameters (e.g., channel, rates, blocklengths) and determine a location in the decoding process where the correct path (typically) falls off. Accordingly, knowing the particular location that a correct decoding path falls off the decoding list implies that that taking CRC or any other error-correction coding before this particular location would help ensure that the correct path does not fall off the list prematurely and survives until the end of the decoding process.

Figure 9:
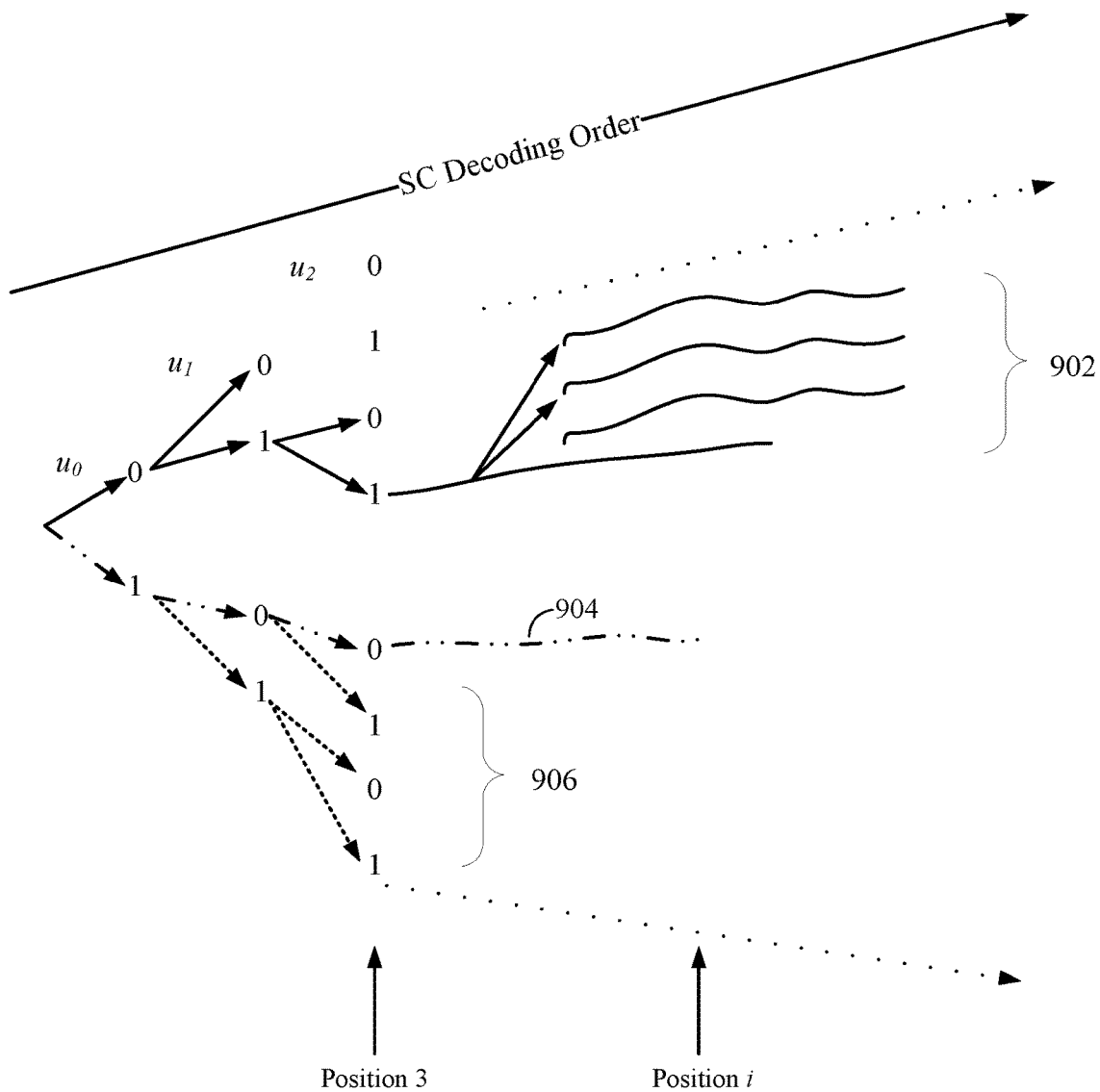
FIG. 9 illustrates an example decoding list, according to certain aspects of the present disclosure.

FIG. 9 illustrates an example of correct paths falling off a decoding list and determining positions to insert error correction codes, for example, based on a statistical analysis, according to certain aspects of the present disclosure. According to certain aspects, at each position in the SC decoding list (e.g., $u_0$, $u_1$, $u_2$) an element in the list is split into two paths, one with the corresponding bit set to 0 and one with that bit set to 1. The top 4 list elements (based on maximum-likelihood metric) are shown at 902 and the correct element (or the transmitted codeword) is shown as the decoding path 904. The decoding paths 906 are the elements outside the top 4. In this example, the correct path falls off the list in position 3 (e.g., while decoding information bit $u_2$) and in position i. Thus, if an error-correction code/CRC is taken till position 3, it would help keep the correct element in the list beyond position 3. Similarly, at later stage of SC decoding, the correct path falls off the list at position i. Thus using an error correction code/CRC for encoding bits up to position i would help keep the correct path in the list beyond position i.

As noted, the placement of the error correction codes may be based on a determination of when a correct decoding path typically falls of the decoding list, for example, as illustrated in FIG. 9. For example, standard list SC decoding can be run multiple times and the most likely position where the correct path falls off the list can be recorded (e.g., positions 3 and i in FIG. 9). An error-correction code/CRC can be used to encode bits till this position and then the decoding process may be repeated multiple times and, most likely, the correct path will now fall off the list much later. This position is now recorded and again an error-correction code/CRC can be used to encode bits till this position. This experiment can be repeated multiple times to find out most likely positions where the correct path falls off the list and suitable parity-check constraints (e.g., CRC bits) are placed at those points to ensure the correct path stays on the list for the longest time.

According to certain aspects, these CRC codes may be generated by the BS based on portions (or subsets) of information bits of the codeword (e.g., the information bits leading up to a rate 1 row-wise block code). In some cases, these portions of information bits may comprise a same number of bits (e.g., meaning that the CRC bits are placed at regular locations within the polar code).

Additionally in some cases, the BS may insert error correction codes (e.g., CRC codes) selectively, generated for at least one of bits of one or more the M channels encoded with a polar code of rate less than 1 or bits of one or more the M channels encoded with a polar code of rate 1 (e.g., as noted above).

Accordingly, a UE may receive the codeword and CRC codes, and, when decoding, may verify portions of the codeword based on the CRC codes (e.g., instead of trying to verify the entire codeword at the end of the decoding process). That is, the UE may receive the codeword including the CRC codes, and may decode a first portion of the codeword leading up to a first CRC code, decode a second portion of the codeword (e.g., after the first CRC) leading up to a second CRC code, and so on. As noted above, the locations of the first and second CRC codes may be selectively inserted by the base station to ensure that the correct decoding path does not fall off the decoding list.

According to certain aspects, if the dimension K is much smaller than M, then a UE may perform list SC decoding for the Polar code $G^k$ by replicating the memory for the K received messages, which may help to reduce latency.

Another way to reduce the latency may be to use certain decoding rules for certain row-wise block codes formed by a row in the codeword. For example, as illustrated in FIG. 8, the BS may insert various 'trivial' codes along the rows of two-dimensional generator matrix, which instruct the UE how to decode a portion of the codeword. For example, an all '0000' row is simply a rate 0 code, which may instruct the UE to not perform decoding; an all '1111' row is a rate 1 code, which may instruct the UE to take hard-decisions of the $G^m$ polar codes, which can be done in parallel; a '0111' row is a single parity-check (SPC) code, which may instruct the UE to take hard-decision and flip the sign of least reliable bit if parity is not satisfied; and a '0001' row is a repetition code, which may instruct the UE to take the sum of all LLRs and then take hard-decision. According to certain aspects, the only non-trivial code is a '0011' row which is a rate ½ Reed-Muller code, in which case, the UE may have a specialized decoder for decoding according to this code.

According to certain aspects, the decoding rules mentioned above correspond to maximum-likelihood decoding for that code. Once the hard-decisions are made for these block codes of length 4, the SC decoder (e.g., in the UE) may be run in parallel along the 4 columns (the M-dimension) and the LLRs for the next block-code in the next row of length 4 is obtained. Since the number of non-trivial codes is small and most of the codes are trivial, it helps reduce the decoding latency of the SC decoder. Note that running the SC decoder in parallel would not be too complex since memory does not need to be replicated and the same hardware that is used for the full Polar code is essentially used for decoding the different portions of the polar code.

Another way to reduce decoding latency may be as follows. For example, again consider the two-dimensional Polar code interpretation and recall that hard decisions may only be made along the rows. Thus, list SC decoding may be performed by the UE for the row-wise Polar code concatenated with a CRC. In this case, the number of CRC bits required would be more than the standard scheme. However, if K is kept small, then the received messages (have more memory) may be replicated to reduce the latency of the list SC decoder. In some cases, this may not be possible when performing the list SC decoding on the whole Polar code. The replication of received messages in this case (i.e., decoding on the whole Polar code) would require prohibitively large memory. Additionally, the CRC bits may be selectively used by the base station to, say, protect the channels in transition and few good channels at an earlier stage of the decoding process to obtain a better performance.

Example Generalized Polar Code Construction

According to certain aspects, rather than using a polar code in both dimensions (i.e., both 'k' and 'm' dimensions, as described above), a non-polar code (e.g., Reed-Muller code or extended Hamming codes or the Reed-Muller-Polar hybrid codes) could be used in a first dimension (e.g., the K-dimension) and a polar code in a second dimension. For example, a base station can first encode the information bits (for each row) using a general non-polar code of appropriate rate (e.g., less than the capacity of the corresponding polarized channel) and then each column may be multiplied by the Hadamard matrix of size M to obtain the final code. In other words, a base station may use a first code (e.g., Reed-Muller, extended Hamming codes, etc.) to encode information bits in a first dimension, and may use a second code (e.g., a Polar code) to further encode the information bits in a second dimension, resulting in a codeword that is the product of the first and second codes.

Figure 10:
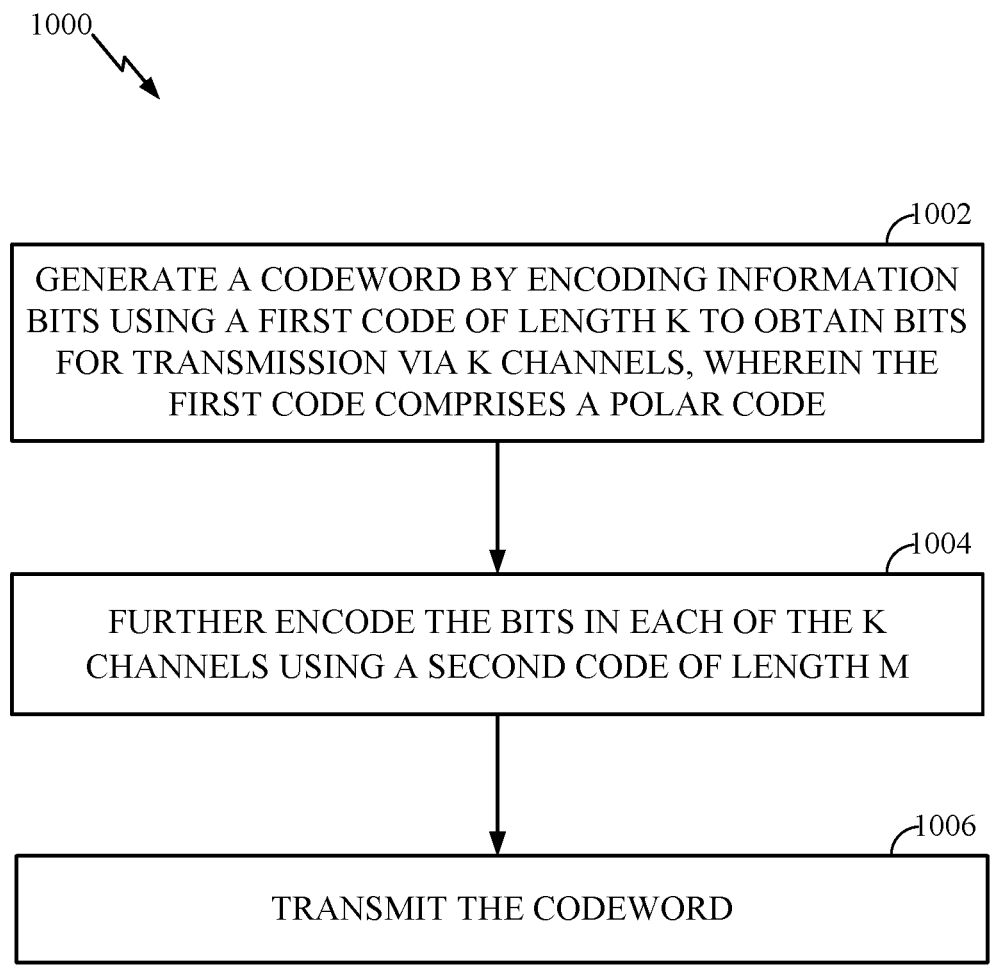
FIG. 10 illustrates example operations for wireless communications by a base station (BS), in accordance with certain aspects of the present disclosure.
Figure 11:
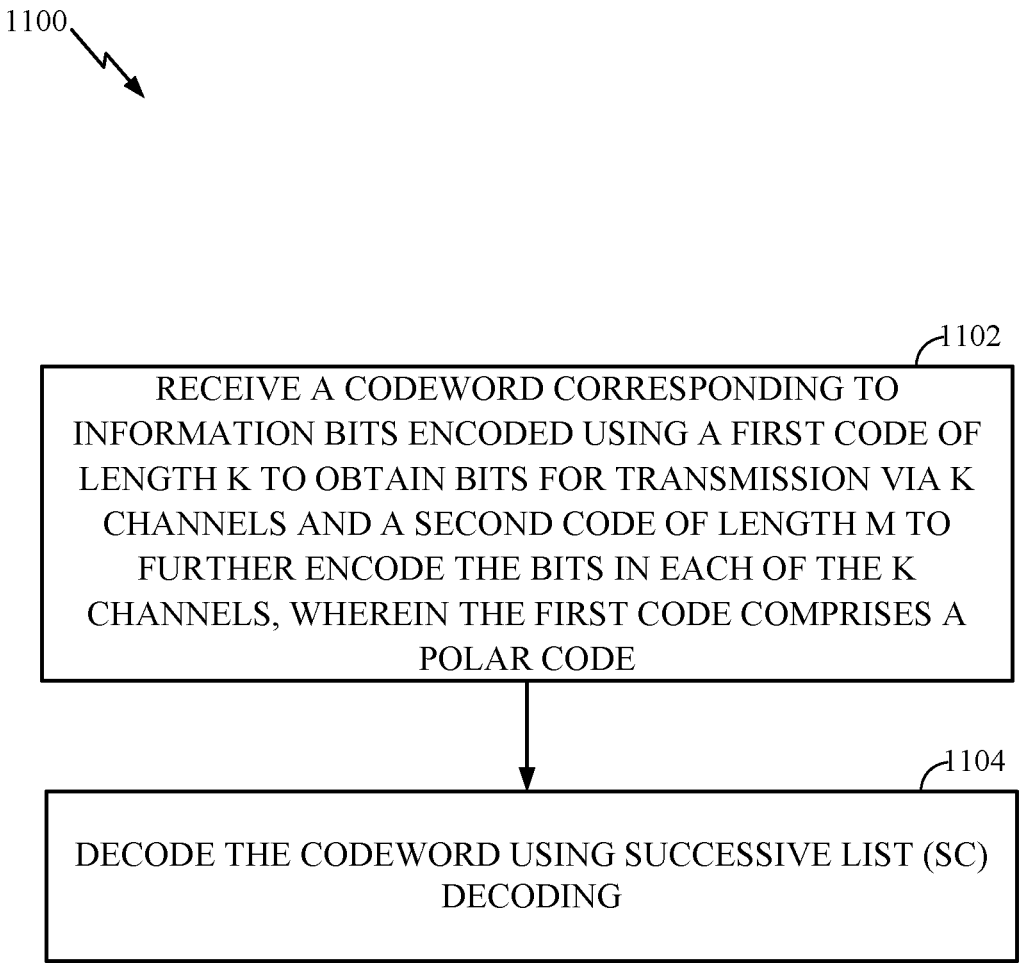
FIG. 11 illustrates example operations for wireless communications by a user equipment (UE), in accordance with certain aspects of the present disclosure.

FIG. 10 illustrates example operations 1000 for wireless communications by a base station (e.g., access point 100/transmitter system 210), for example, for generating a codeword using two different coding schemes. It should be noted that, while operations 1000 are described as being performed by a base station, operations 1000 could also be performed by a user equipment (UE) (access terminal 116). In other scenarios, aspects can be used by devices capable of acting like both UEs/BSs in a hybrid fashion as well as in virtual settings (such as SDN/NFV scenarios).

Operations 1000 begin at 1002 by generating a codeword by encoding information bits using a first code of length K to obtain bits for transmission via K channels. At 1004, the BS further encodes the bits in each of the K channels using a second code of length M, wherein the first code comprises a polar code. At 1006, the BS transmits the codeword, for example, using one or more transmitters (e.g., TMTR 222) and one or more antennas (e.g., one or more antennas 224). It should be understood that the codeword can be transmitted in different ways, such as transmitted over a hardwire line or over a wireless medium, or stored in a computer-readable medium (e.g., a compact disk, USB drive), etc.

FIG. 1100 illustrates example operations 1100 for wireless communications by a user equipment (UE) (e.g., access terminal 116/receiver system 250), for example, for decoding a codeword using two different coding schemes. It should be noted that, while operations 1100 are described as being performed by a UE, operations 1100 could also be performed by a base station (e.g., access point 100). In other scenarios, aspects can be used by devices capable of acting like both UEs/BSs in a hybrid fashion as well as in virtual settings (such as SDN/NFV scenarios)

Operations 1100 begin at 1102 by receiving a codeword corresponding to information bits encoded using a first code of length K to obtain bits for transmission via K channels and a second code of length M to further encode the bits in each of the K channels, wherein the first code comprises a polar code. It should be understood that the codeword can be received in different ways, such as received over a hardwire line or over a wireless medium, or from a computer-readable medium (e.g., a compact disk, USB drive), etc. At 1104, the UE decodes the codeword using successive list (SC) decoding.

As noted above, instead of encoding using a Polar code in both the first dimension and the second dimension, general non-polar codes (e.g., an extended Hamming code or a Reed-Muller code) may be used along with polar codes. More precisely, consider the stream of information bits, $u^{(i)} = (u_1^{(i)}, u_2^{(i)}, \ldots, u_{KR}^{(i)})$, where R is the rate of transmission and $1 \le i \le M$. Each of the streams $u^i$ may first be encoded in the $G^k$ direction using the generator matrix for a linear block code such as a Reed-Muller code, a Reed-Muller-Polar hybrid code, or an extended Hamming code to obtain a set of encoded bits $x^{(i)}$. For example, $x^{(i)} = u^{(i)}G$ where G is the generator matrix of any linear block code such as the Reed-Muller code, a Reed-Muller-Polar hybrid code, an extended Hamming code, or a low-density parity check (LDPC) code. Then, as before, the set of encoded bits, $x^{(i)}$, resulting from being encoded using a linear block code may then be further encoded in the $C^m$ direction using a rate 1 polar code.

Additionally, according to certain aspects, the linear block codes (i.e., the non-Polar codes) may use of a variety of rates, each of which may be tuned to the capacity of the underlying virtual channel. In other words, each of the virtual channels may be further encoded with another linear block code whose rate is specifically tuned to the capacity of that virtual channel.

As noted above, after receiving a codeword generated using two coding schemes, decoding by the UE again proceeds from top to bottom by first decoding the row-wise code and then running SC decoder along the column (in parallel for all the four columns). More precisely, the row-wise codes may be decoded by the UE, which may then be used to decode the Polar code. In other words, decoding at the UE happens sequentially and jointly between the Polar code and the non-polar code. For example, decoding may proceed as follows. The UE may begin decoding at the top row, for example, in FIG. 8. At any ith row, the UE may run an SC decoder first on each column in parallel (along the 4 columns we run 4 SC decoders as in FIG. 8). Then the UE may compute the LLR for each bit in the ith row using the SC decoder tree. Once the LLRs are computed by the UE for each bit in the ith row, the UE may invoke the ith row-wise decoder (for the non-polar code) and decode the codeword or maintain a list of codewords if a generalized list decoder is used.

According to certain aspects, an advantage of using, say, the Reed-Muller-Polar hybrid codes, to further encode the "virtual" channels of a polar code may be that these codes provide improved minimum distance over the standard Polar code without sacrificing the information rate by using a CRC.

Another way to reduce decoding latency may be through the use of generalized list SC decoding. For example, assuming the two-dimensional interpretation of the Polar code, a list covering all possible codewords of the row-wise block codes, rather than individual bits, may be maintained. More precisely, instead of keeping track of individual bits, a list covering all possible codewords of the row-wise block codes may be maintained by the UE and used to prune decoding paths that are, for example, not possible. According to certain aspects, this would enable high performance list SC decoding. However, the list size may need to be kept small to enable low complexity decoding, for example, by only keeping the top (e.g., based on maximum log (ML) metric) codewords in the list. That is, to keep the list small, the UE may keep only the top codewords in the list, selecting these codewords based on an ML metric. Additionally, taking the CRC as shown in FIG. 8 would help to keep the number of paths small and also help maintain the correct path in the list for a longer time.

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transmitter 222) and/or an antenna(s) 224 of the access point 210 illustrated in FIG. 2, the transmitter 254 and/or the antenna 252 of the access terminal 250 illustrated in FIG. 2, the transmitter 310 and/or antenna (s) 316 depicted in FIG. 3, and/or the antenna 418 illustrated in FIG. 4. Means for receiving may comprise a receiver (e.g., the receiver 222) and/or an antenna(s) 224 of the access terminal 250 illustrated in FIG. 2, the receiver 312 and/or antenna(s) 316 depicted in FIG. 3, and/or the antenna 502 illustrated in FIG. 5. Means for generating, means for determining, means for inserting, means for encoding, means for decoding, means for verifying, means for maintaining, and/or means for keeping may comprise a processing system, which may include one or more processors, such as the RX data processor 242, the TX data processor 214, and/or the processor 230 of the access point 210 illustrated in FIG. 2, the RX data processor 260, the TX data processor 238, and/or the processor 270 of the access terminal 250 illustrated in FIG. 2, the processor 304 and/or the DSP 320 portrayed in FIG. 3, the encoder 406 illustrated in FIG. 4, and/or the decoder 516 illustrated in FIG. 5.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, the term receiver may refer to an RF receiver (e.g., of an RF front end) or an interface (e.g., of a processor) for receiving structures processed by an RF front end (e.g., via a bus). Similarly, the term transmitter may refer to an RF transmitter of an RF front end or an interface (e.g., of a processor) for outputting structures to an RF front end for transmission (e.g., via a bus).

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 122 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of wireless communications, comprising:
   generating a codeword by encoding a sequence of information bits based on a polar code, wherein generating the codeword comprises:
   determining a plurality of locations within the polar code having a rate of 1;
   generating error detection codes based on portions of the sequence of information bits, the portions being defined by the plurality of locations within the polar code having a rate of 1;
   inserting the error detection codes in the sequence of information bits at locations corresponding to the plurality of locations within the polar code having a rate of 1; and
   generating the codeword based on the sequence of information bits, including the error detection codes, and the polar code; and
   transmitting the codeword over a wireless channel.

2. The method of claim 1, wherein the error detection codes comprise cyclic redundancy check (CRC) information.

3. The method of claim 2, wherein generating the error detection codes comprises generating the error detection codes from preset subsets of the information bits, wherein each subset has a same number of information bits.

4. The method of claim 1, wherein the polar code is of length N and further comprising:
   encoding the information bits using a first polar code of length K to obtain bits for transmission via M virtual channels; and
   further encoding the bits in each of the M virtual channels using a second polar code of length M, wherein N=K×M.

5. The method of claim 4, wherein generating the error detection codes comprises generating the error detection codes for at least one of:
   bits of one or more of the M virtual channels encoded with the second polar code, wherein the second polar code has a rate less than 1; or
   bits of one or more of the M virtual channels encoded with the second polar code, wherein the second polar code has a rate of 1.

6. The method of claim 1, further comprising inserting into the codeword one or more codes indicating how to decode portions of the codeword, wherein the one or more codes comprise at least one of a single parity check (SPC) code, a repetition code, or a rate zero code.

7. A method of wireless communications, comprising:
   generating a codeword by encoding a sequence of information bits based on a polar code, wherein generating the codeword comprises:
   determining a plurality of locations within the polar code where a correct decoding path falls off a decoding list associated with the polar code;
   generating error detection codes based on portions of the sequence of information bits, the portions being defined by the plurality of locations;
   inserting the error detection codes in the sequence of information bits corresponding to the determined plurality of locations in the polar code; and
   generating the codeword based on the sequence of information bits, including the error detection codes, and the polar code; and
   transmitting the codeword over a wireless channel.

8. The method of claim 7, wherein the error detection codes comprise one or more parity bits.

9. The method of claim 7, wherein the polar code is of length N and further comprising:
   encoding the information bits using a first polar code of length K to obtain bits for transmission via M virtual channels; and
   further encoding the bits in each of the M virtual channels using a second polar code of length M, wherein N=K×M.

10. The method of claim 9, wherein generating the error detection codes comprises generating the error detection codes for at least one of:
    bits of one or more the M virtual channels encoded with the second polar code, wherein the second polar code has a rate less than 1; or bits of one or more the M virtual channels encoded with the second polar code, wherein the second polar code has a rate of 1.

11. The method of claim 7, further comprising inserting into the codeword one or more codes indicating how to decode portions of the codeword, wherein the one or more codes comprise at least one of a single parity check (SPC) code, a repetition code, or a rate zero code.

12. The method of claim 7, further comprising determining the locations of where a correct decoding path falls off a decoding list associated with the polar code based, at least in part, on one or more decoding parameters.

13. The method of claim 12, wherein the one or more decoding parameters comprises at least one of a channel associated with the polar code, a code rate associated with the polar code, or a block-length associated with the polar code.

* * * * *